United States Patent [19]

Koenig

[11] 4,023,144

[45] May 10, 1977

[54] PARALLEL TO SERIAL DIGITAL CONVERTER

[75] Inventor: Harry J. Koenig, San Diego, Calif.

[73] Assignee: The United States of America as represented by the Secretary of the Navy, Washington, D.C.

[22] Filed: Apr. 2, 1976

[21] Appl. No.: 673,230

[52] U.S. Cl. .......................................... 340/172.5
[51] Int. Cl.² ........................................ G06F 5/04
[58] Field of Search ............................... 340/172.5

[56] References Cited

UNITED STATES PATENTS

| 3,277,446 | 10/1966 | Diamant et al. | 340/172.5 |
| 3,333,253 | 7/1967 | Sahulka | 340/172.5 |
| 3,395,400 | 7/1968 | De Witt et al. | 340/172.5 |

*Primary Examiner*—Raulfe B. Zache
*Attorney, Agent, or Firm*—R. S. Sciascia; G. J. Rubens

[57] ABSTRACT

A high speed parallel to serial digital converter includes a data shift register, a control shift register and control circuitry. During a control cycle a control input comprising a set of control bits in parallel form is converted by the control shift register into serial form. The serialized control bits are coupled to a register load selector which responds to the control bits to appropriately signal the control circuitry so that at the end of the control cycle the converter will commence either another control cycle or a data cycle. During a data cycle an input data word comprising data bits in parallel form is converted by the data shift register into serial form. At the end of a data cycle timing circuitry signals the control circuitry to commence a reset cycle during which the converter is reset to commence another control cycle.

11 Claims, 4 Drawing Figures

PARALLEL TO SERIAL DIGITAL CONVERTER

BACKGROUND OF THE INVENTION

The present invention pertains to parallel to serial (P/S) converters for receiving digital information in parallel form and transmitting it in serial form, and particularly to P/S converters wherein information contained in sets of parallel-form control bits asynchronously instructs the converter to serialize and transmit other information contained in sets of parallel-form data bits.

In some digital computer systems such as the NTDS (Navy Tactical Data System) the output of a system computer equipment comprises data words and sets of control bits, all of which are in parallel form, wherein each data output may occur at any unspecified time and the presence or absence of a data word at a given time is indicated by an instruction contained in the output control bits at that time. If the parallel data outputs must be converted into serial form, such as when NTDS parallel outputs are to be coupled into the channels of the High Speed Data Switching System (HSDS), which operates on serialized information, there exists a need for a P/S converter which can determine the times at which the equipment has a data output. In addition, a P/S converter coupling the outputs of an NTDS equipment to a channel of the HSDS must be capable of very rapid operation, since it may receive data words in parallel form at a rate in excess of 125 kilowords per second from the equipment and transmit serialized data words to the HSDS at a rate in excess of 10 megabits per second.

SUMMARY OF THE INVENTION

The present invention provides a high speed parallel to serial digital converter which may be used to convert parallel-form data words when they occur at the output of a source of digital information wherein the time of occurrence of each data word is unknown and wherein some of the bits in a set of parallel-form control bits indicate whether a data word is present at the source output at a given time. All the components of the P/S converter may be placed on one circuit board, and the P/S converter operates in one of three cycles. During a control cycle a set of control bits is loaded into a control shift register and then shifted out in serial form. The serialized control bits are coupled into a register load selector, which responds to some of them, to appropriately signal control circuitry so that at the end of the control cycle either (1) another control cycle will commence if the serialized control bits indicate the absence of a data word at the output of the digital information souce, or (2) a data cycle will commence if the serialized control bits indicate the presence of a data word. There may be a succession of control cycles before a data cycle is commenced. During a data cycle the parallel-form data word at the source output is loaded into a data shift register, shifted out so that the data word is in serialized form, and then coupled to the output of the converter. At the conclusion of a data cycle timing circuitry sends a signal to the control circuitry so that a reset cycle commences to reset the converter for another control cycle. The P/S converter disclosed in the invention is capable of receiving data information at a rate in excess of 125 kilowards per second and transmitting serialized data at a rate in excess of 10 megabits per second. During each cycle relatively little power for the amount of digital information converted per unit time is required since the number of components comprising the converter is minimized. Timing of the P/S converter may be controlled by a clock generating a symmetrical periodic waveform.

STATEMENT OF THE OBJECTS OF THE INVENTION

An object of the invention is to provide an improved means for converting digital information from parallel form to serial form.

Another object is to provide an improved parallel to serial converter which is responsive to control information in parallel form to determine the times at which it must convert data information in parallel form.

Another object is to provide an improved parallel to serial converter which may receive digital information in parallel form at a rate in excess of 125 kilowards per second and transmit digital information in serial form at a rate in excess of 10 megabits per second.

Another object is to provide an improved parallel to serial converter which may receive the parallel-form output of an NTDS computer equipment and serialize the output for transmission through a channel of the HSDS.

Another object is to provide an improved parallel to serial converter for coupling the output of an NTDS equipment to a channel of the HSDS which may be timed to operate synchronously with a serial to parallel converter which couples the output of the same HSDS channel to the input of another NTDS equipment.

Other objects, advantages and novel features of the invention will become apparent from the following detailed description of the invention when considered in conjunction with the accompanying drawings. Brief Description of the Drawings FIG. 1 is a schematic diagram illustrating an embodiment of the present invention.

DESCRIPTION OF THE PREFERRED EMBODIMENT

Figure 1:
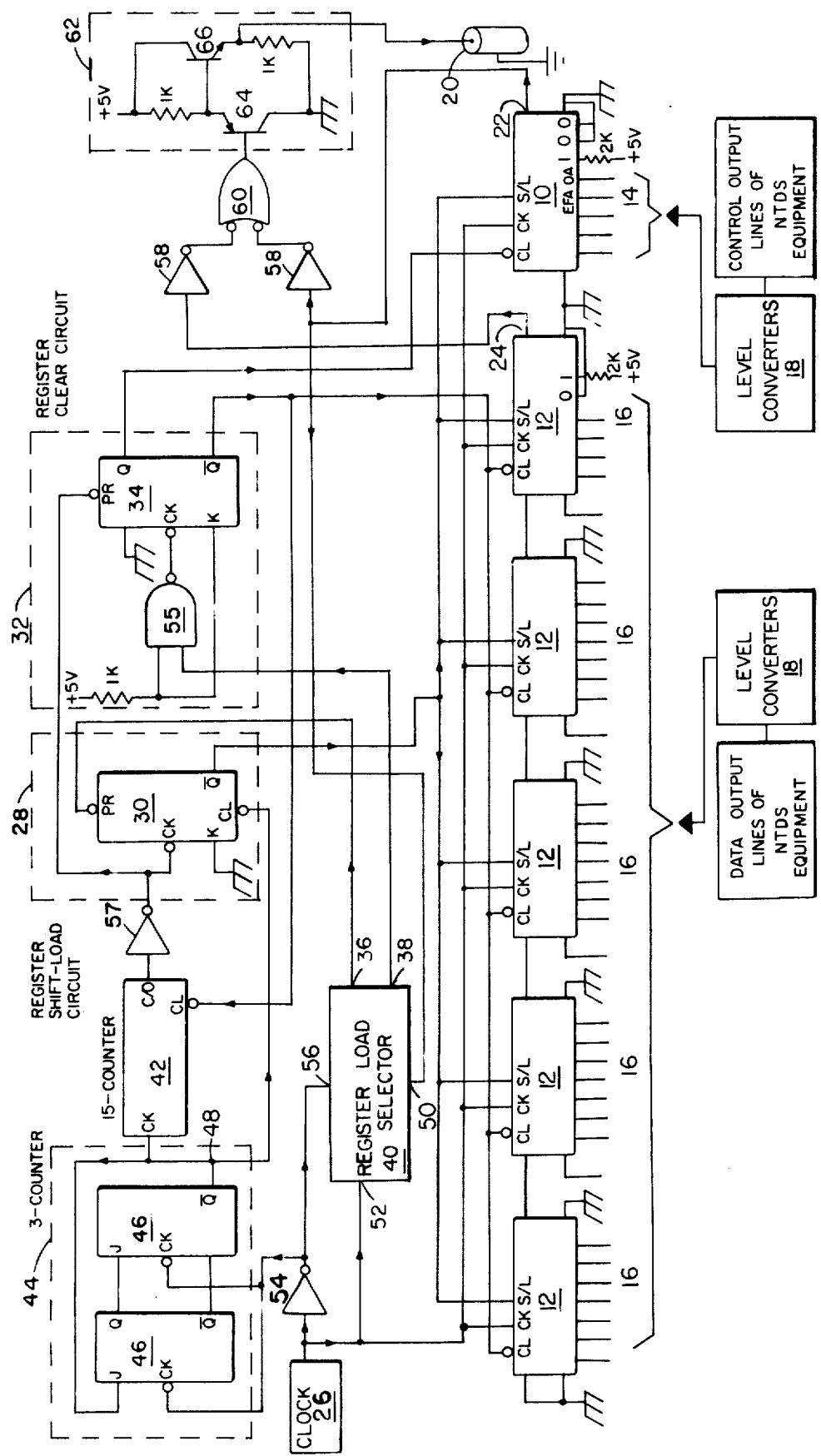

FIG. 1 illustrates a high speed parallel to serial (P/S) digital converter wherein control shift register 10, which may be an 8-bit TTL P/S shift register, and data shift register 12, which may comprise five 8-bit TTL P/S shift registers connected in series, have input terminals 14 and 16 coupled to five control and thirty-six data output lines, respectively, of an NTDS (Navy Tactical Data System) computer equipment through level converters 18, which convert the NTDS voltage level (wherein a voltage of −15 indicates a logic 0 and a voltage of 0 indicates a logic 1) to the TTL voltage of the converter (wherein 0 volts corresponds to a logic 0 and 5 volts correspond to a logic 1). At unspecified times a parallel-form data word comprising up to 36 digital bits becomes present on the data output lines of the NTDS equipment to be converted to serial form by the P/S converter and then coupled through coaxial cable connector 20 to a channel of the High Speed Data Switching System (HSDS). Whenever a data word becomes present, the information on the control output lines of the computer equipment contains an instruction to the P/S converter to convert and transmit the data word.

To determine when an instruction to convert data is present the converter periodically commences a conrol cycle by loading a parallel-form control format into control register 10. The control format comprises the five bits of control information imposed on terminals 14 at the beginning of the control cycle, two "0" bits provided by connecting two other input terminals of register 10 to ground, and a "1" start bit provided by connecting a third input terminal to a current limited 5-volt source. the "1" start bit is required for control purposes, and the "0" s provide two extra bits to make up a 8-bit control format which will not be confused with the start bit "1." The eight input terminals of register 10 are arrayed so that a loaded control format will always be shited out of register 10 through output terminal 22 in such order that the two "0" bits will be the first and second bits shifted out, the "1" start bit will be third, and the fourth and fifth bits will be the Output Acknowledge (OA) and External Function Acknowledge (EFA) bits, respectively, of the set of control bits imposed on input terminals 14. If both the OA and EFA bits of given control format are "0", at the end of the control cycle the converter will commence another control cycle. However, if either the OA or EFA bit is "1" the converter will commence a data cycle at the end of the control cycle. By definition of the NTDS the OA and EFA bits will not both be one at the same time. The outputs of the other three output control lines of the coupled NTDS equipment do not affect the converter operation.

A data cycle commences when a parallel-form data format is loaded into data register 12. A data format comprises a data word coupled from the data output lines of the equipment to terminals 16, a "0" bit provided by connecting another input terminal of register 2 to ground, and a "1" start bit provided by connecting an input terminal to a current limited 5-volt source. he 38 input terminals of register 12 are arrayed so that a loaded data format will always be shifted out through output terminal 24 in such order that the "1" data start bit will be shifted out first followed by "0" t.

Each data cycle must be followed by a reset cycle during which the converter is reset to enable it to commence further control cycles. A reset cycle is similar to control cycle in that it commences when register 10 is loaded with a format comprising the information on the eight input terminals of register 10 at the instant of loading. By definition of the NTDS, an instruction to convert another data word will not occur before the format of a reset cycle has been loaded so that the OA and EFA bits of each reset format will always be "0".

The disclosed embodiment of the invention is designed to convert data at a rate of 125 kilowords per second and to transmit it in serial form at a rate of 10 megabits per second. To allow converter operation at these rates each data cycle has a duration of 4800 nanoseconds and each control and each reset cycle has duration of 1200 nanoseconds.

To enable either register 10 or 12 to be loaded it just (1) be in load condition by having a "0" at its shift load (S/L) terminal (s) and (2) be uncleared by having "1" at its low true clear (CL) terminal(s). When a register is in both load and unclear condition all the digital bits coupled to its input terminals are simultaneously loaded when its clock (CK) terminal(s) receives the rising edge of a clock pulse. To enable either register to shift out a loaded format, the resister must (1) be in shift condition by having a "1" at its S/L terminal(s) and (2) be uncleared whereupon the format will be shifted out of the register, bit by bit, by the rising edges of successive clock pulses.

The loading, shifting and clearing of both registers and consequently the operation of the converter in each cycle, is controlled by clock 26, which generates symmetrical periodic pulses of 50-nonoseconds duration to the register CK terminals, by register shift-load circuit 28 and by register clear circuit 32. The duration of the clock pulses is selected to provide the period for each control, data and reset cycle required to allow the specified rate of conversion. The output of register shift-load cirucit 28 (the inverterd output Q of flip-flop 30) is coupled to the S/L terminals of both registers 10 and 12 so that both are in load condition when the output of register shift-load circuit 28 is "0" and in shift condition when it is "1". The output of register clear circuit 32 (the output of Q of flip-flop 34) is coupled to the CL terminal of control register 10 and the inverted output of register clear circuit 32 (the inverted output Q of flip-flop 34) is coupled to the CL terminals of data register 12 so that one register will always be cleared whenever the other is uncleared. Consequently, as the enabled register loads and shifts out a format, the other register will synchronously shift out "0"s.

The timing of register shift-load circuit 28 and register clear circuit 32 is determined by signals from terminals 36 and 38, respectively, of register load selector 40 and by 15-counter 42, which only counts during data cycles and is dormant during control cycles due to the state of the signal at its CL terminal. In addition, register shift-load circuit 28 is timed by three-counter 44. Three-counter 44, which may comprise two JK flip-flops 46, connected as shown, counts once each time it is clocked by a pulse from clock 26 and resets after every third count. The output of three-counter 44, the signal at terminal 48, is "0" during its first count, rises to "1" during its second and third counts, and returns to "0" at the beginning of the next three-counter cycle.

As the converter commences operation in a given control cycle, the output of register shift-load circuit 28 is "0" and the output of register clear circuit 32 is "1" to enable the control format to be loaded into control register 10 by the rising edge of a clock pulse from clock 26. A three-counter cycle always commences its third count concurrently with the commencement of any cycle, so that the next clock pulse causes three-counter 44 to fall to "0", whereupon flip-flop 30 is cleared and register 10 is placed in shift condition. Consequently, successive pulses following the shift enable pulse serially shift the bits of the control format out of register 10 and into register load selector 40 through terminal 50.

Register load selector 40, which receives clock pulses through terminal 52 and inverted clock pulses from inverter 54 through terminal 56, is designed so that 1150-nanoseconds after the commencement of the given control cycle it responds to the "1" start bit of the control format by sending a load enable signal of "0" from terminal 36 to the low true preset (PR) terminal of flip-flop 30. As flip-flop 30 is preset the output of register shift-load circuit 28 becomes "0, " returning both registers to load condition. Simultaneously (within 15-nanoseconds) selector 40 sends a register select signal of either "0" or "1" to NAND gate 55 of register clear cirucit 32 from terminal 38.

If the OA and EFA bits of the control format shifted into selector 40 are both "0," indicating the absence of a data word on terminals 16, the register select signal is "0" so that the output of NAND gate 55 is "1," which is coupled to the CK terminal of flip-flop 34. Flip-flop 34 has a low true CK terminal so that it is not clocked by the "1" and its output Q remains "1," keeping control register 10 uncleared. Since circuits 28 and 32 respond to their respective signals from selector 40 in less than 50-nanoseconds, register 10 is enabled to load another control format on the rising edge of the next clock pulse and the converter commences another control cycle, 1200-nanoseconds after the commencement of the given control cycle.

If either the OA or EFA bits of the control format shifted into selector 40 during the given control cycle is a "1," selector 40 will send a register select signal of "1" to NAND gate 55 whereupon flip-flop 34 is clocked by the "0" output of NAND gate 55 so that the output of register clear circuit 32 becomes "0" and the inverted output becomes "1." Control register 10 is thereby cleared and data register 12 is uncleared, enabling it to load a data format on the rising edge of the next clock pulse. Register 12 is then shift-enabled, when three-counter 44 again clears flip-flop 30. Subsequent clock pulses serially shift the thirty-eight bit data format out of register 12 through 24 whereupon "0"s are shifted out until the data cycle is ended.

The signal from terminal Q of the flip-flop 34 which unclears register 12 also unclears 15-counter 42 by applying a "1" to its low true CL terminal, enabling 15-counter 42 to subsequently count out a "0" at its carryout (C/O) terminal each time it is clocked by the application of a "1" to its CK terminal from the output of three-counter 44. Three-counter 44 first rises to "1" 200 nanoseconds after the date cycle has commenced, causing 15-counter 42 to count out a "0." Every 300 nanoseconds thereafter three-counter 42 clocks 15-counter 42, until 4400 nanoseconds after the commencement of the data cycle, when 15-counter 42 is clocked a 15th time, whereupon it counts out a "1," which is inverted by inverter 57 and coupled to the low true PR terminal of flip-flop 34 so that the output Q of flip-flop 34 returns to "1." Simultaneously the "0" output of inverter 54 clocks flip-flop 30 so that the output of register shift-load circuit 28 becomes "0," clearing data register 12 and 15-counter 42 and unclearing control register 10. Consequently, the next clock pulse, occuring 4500 nanoseconds after the commencement of the data cycle, commences a reset cycle by loading a format into register 10 in which both the OA and EFA bits are "0."

The serialized output of each register is coupled to an inverter 58, the outputs of which are coupled to the low true inputs of OR gate 60. Since the register that is cleared always has an output of "0"s concurrent with the serialized output of the enabled register, the output of OR gate 60 will always be identical to the output of the enabled register. Inverters 58 and OR gate 60 comprise a selection gate to insure that only the output of the enabled register is coupled to the output of the P/S converter. The output of OR gate 60 is coupled to amplifier 62 which comprises PNP transister 64 and NPN transister 66 coupled together as two emitter followers. The particular mode of coupling the transistors provides very rapid current amplification with virtually no through voltage drop. The output of amplifier 62 is coupled to coaxial cable connector 20.

Figure 2:
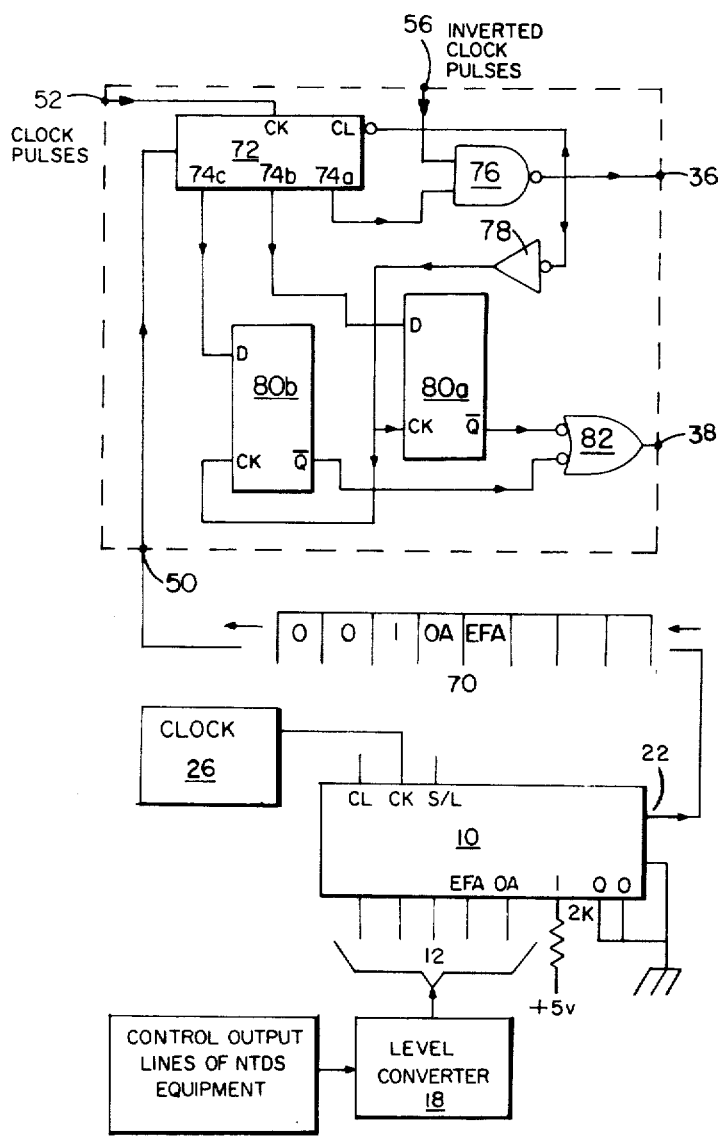
FIG. 2 is a schematic diagram illustrating a register load selector for the embodiment of FIG. 1.

FIG. 2 illustrates a serialized control format 70 coupled from output terminal 22 of control register 10 into terminal 50 of register load selector 40 during a given control cycle. Each of the serialized control format bits is shifted into serial to parallel (S/P) converter 72, which may be an 8-bit TTL S/P shift register, as it is shifted out of control register 40. Terminal 74a is the eighth output terminal of S/P converter 72 so that twelve clock pulses are required to move the start bit "1" from the input of register 10 to terminal 74a of S/P converter 72 (one pulse to load the parallel-form control format into register 10, one pulse to place register 10 in shift condition, two pulses to shift the two "0"s preceding the start bit "1" out of register 10, and eight pulses for shifting the start bit "1" into and through the eight output positions of S/P converter 72).

On the rising edge of the 12th clock pulse, or 1100-nanoseconds after the commencement of the given control cycle, the start bit "1" is shifted to terminal 74a position and coupled into NAND gate 76. The twelfth clock pulse also shifts the OA bit to terminal 74b, so that it is coupled to the input terminal of D flip-flop 80a, and the EFA bit to terminal 74c, so that it is coupled to the input terminal of D flip-flop 80b. Since the other terminal of NAND gate 76 receives inverted clock pulses, during the 50-nanosecond interval following the application of the start bit "1" to NAND gate 76 the output of NAND gate 76 is "1". At the end of the 50-second interval, or 1150-nanoseconds from commencement of the given control cycle, the inverted clock input to NAND gate 76 becomes "1" so that the output of NAND gate 76 is "0". This "0" instantaneously (within 25-nanoseconds) clears S/P converter 72 and provides the load enable signal through terminal 36 to register shift-load circuit 28. Simultaneously the "0" output of NAND gate 76 is inverted to a "1" by inverter 78 so that flip-flops 80a and 80b are clocked. Consequently, the inverted output Q of flip-flop 80a becomes the inverse of the OA bit and the inverted output Q of flip-flop 80b becomes the inverse of the EFA bit. If both OA and EFA bits are "0," the outputs Q of flip-flops 80a and 80b will be "1"s coupled to the low true inputs of OR gate 82 so that the output of OR gate 82, the register select signal, will be "0. " However, if either the OA or the EFA bit is "1", indicating the presence of a data word to be converted by the converter, one of the inputs to OR gate 82 will be a "0" so that a register select signal of "1" will be coupled through terminal 38 to register clear circuit 32 thereby commencing a data cycle.

Figure 3:
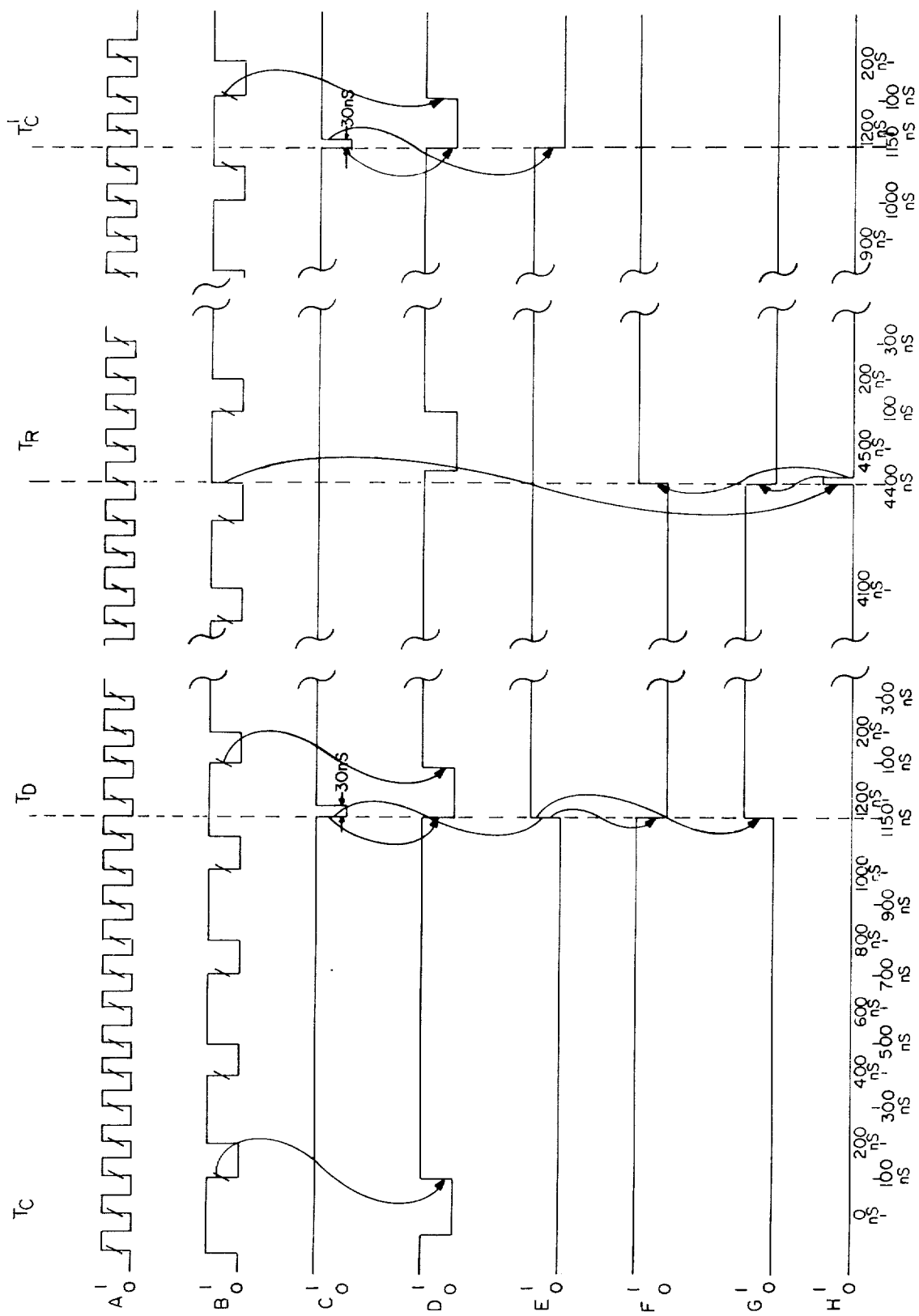
FIG. 3 is a timing diagram illustrating the outputs of the control and timing circuits of the embodiment of FIG. 1.

FIG. 3 illustrates the time relationships between the output of clock 26 (line A), the output of three-counter 44 (line B), the output of NAND gate 76, (line C), the output Q of flip-flop 30 (line D), the output of OR gate 82 (line E) the output Q of flip-flop 34 (line F), the inverted output Q of flip-flop 34 (line G), and the output of 15-counter 42 (line H). If a control cycle commences at time $T_c$, on the rising edge of a clock pulse, and the loaded control format contains an OA or EFA bit of "1," 1150 nanoseconds after $T_c$ the output of NAND gate 76 drops to "0" so that the data shift register 12 is enabled to load a data format and control register 10 is cleared. The data format is loaded into data register 12 at time $T_D$ by the rising edge of the thirteenth clock pulse occurring after $T_c$, or 1200 nanoseconds after $T_c$. During the data cycle the output of OR gate 82 remains "1." 4400 nanoseconds after time $T_D$, the output of 15-counter 42 rises to 1, clearing data register 12 and enabling control register 10 to load another format. At time $T_R$, 4500 nanoseconds after time $T_D$, a clock pulse loads a format into control register 10 which may not contain an OA or EFA bit of 1. Consequently, at 1150 nanoseconds after $T_R$, when flip-flops 80a and 80b are clocked by the output of NAND gate 76, the output of OR gate 82 drops to "0," enabling another control cycle to commence at time $T_c'$, 1200 nanoseconds after $T_R$.

Figure 4:
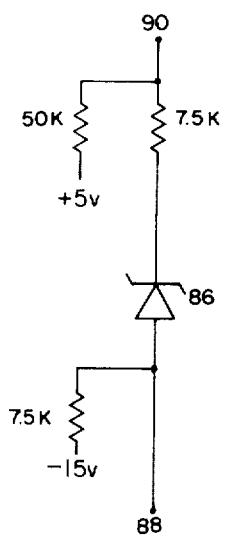
FIG. 4 is a schematic diagram illustrating a level converter for the embodiment of FIG. 1.

FIG. 4 illustrates a level converter coupled between a control output line of the NTDS equipment and an input terminal 14 of control register 10 or between a data output line of the equipment and an input terminal 16 of data register 12. Zener diode 86, which may be a 3.3 volt IN746A diode, is coupled as shown so that an input to terminal 88 of −15 volts will cause a zero output at terminal 90 when connected to a normal TTL load and an input of zero at terminal 88 will cause an output of +5 volts at terminal 90.

Obviously many modifications and variations of the present invention are possible in the light of the above teachings. It is therefore to be understood that within the scope of the appended claims the invention may be practiced otherwise than as specifically described.

What is claimed is:
1. An apparatus for accepting digital information in parallel form and transmitting digital information in serial form wherein said digital information comprises control information and data information, said apparatus comprising:
   a. a control input means for accepting said parallel-form control information;
   b. a control shift register means coupled to said control input means for converting said control information from parallel form to serial form during a control cycle of said apparatus;
   c. a data input means for accepting said parallel-form data information;
   d. a data shift register means coupled to said data input means for converting said data information from parallel form to serial form during a data cycle of said apparatus;
   e. control means coupled to said control shift register means and to said data shift register means for operating said apparatus in a control cycle or a data cycle and for preventing said apparatus from operating in both cycles at the same time;
   f. register selector means coupled to said control means and having its input coupled to the output of said control shift register means for responding to an instruction contained in the control information converted during a given control cycle to signal said control means to operate said apparatus in either another control cycle or a data cycle after the conclusion of the given control cycle;
   g. timing means coupled to said control means for regulating the time duration of each of said data cycles;
   h. a control coupling means for coupling the output of said control shift register means to the output of said apparatus;
   i. a data coupling means for coupling the output of said data shift register means to the output of said apparatus.

2. The apparatus of claim 1 wherein each of said control cycles may be followed by a data cycle or by one or more control cycles.

3. The apparatus of claim 2 wherein the time duration of all of said control cycles is equal and the time duration of all of said data cycles is equal.

4. The apparatus of claim 3 wherein said control shift register means and said data shift register means each comprises a parallel to serial shift register means, each of said parallel to serial shift register means having a clock terminal.

5. The apparatus of claim 4 wherein a clock means is provided for simultaneously coupling clock pulses to the clock terminal of both the control shift register means and the data shift register means, each of said clock pulses being also coupled to said register selector means and to said timing means.

6. The apparatus of claim 5 wherein a control cycle commences when control information comprising a set of control bits in parallel form is loaded into said control shift register means, each of said sets of control bits including a start bit which has the same logic value in each control bit set.

7. The apparatus of claim 6 wherein a data cycle commences when data information comprising a set of data bits in parallel form is loaded into said data shift register means.

8. The apparatus of claim 7 wherein said register selector means responds to the start bit of the control information of a given control cycle to signal said control means to conclude the given control cycle and commence another cycle of operation.

9. The apparatus of claim 8 wherein said control coupling means and said data coupling means are coupled to the output of said apparatus through an output selector means for coupling only the output of the control shift register means to the output of said apparatus during each of said control cycles and for coupling only the output of the data shift register means to the output of said apparatus during each of said data cycles.

10. The apparatus of claim 9 wherein amplifying means are coupled between the output of said output selector means and the output of said apparatus for amplifying the digital output of said apparatus.

11. The apparatus of claim 10 wherein said apparatus accepts data information comprising parallel-form data words at a rate in excess of 125-kilowords per second and transmits data information comprising serial-form data words at a rate in excess of 10-megabits per second.

* * * * *